(12) United States Patent
Niino

(10) Patent No.: US 10,645,824 B2
(45) Date of Patent: May 5, 2020

(54) ELECTRONIC COMPONENT HOUSING PACKAGE AND ELECTRONIC APPARATUS

(71) Applicant: KYOCERA Corporation, Kyoto-shi, Kyoto (JP)

(72) Inventor: Noritaka Niino, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 71 days.

(21) Appl. No.: 14/900,675

(22) PCT Filed: Aug. 22, 2014

(86) PCT No.: PCT/JP2014/072034
§ 371 (c)(1),
(2) Date: Dec. 22, 2015

(87) PCT Pub. No.: WO2015/029907
PCT Pub. Date: Mar. 5, 2015

(65) Prior Publication Data
US 2016/0157366 A1    Jun. 2, 2016

(30) Foreign Application Priority Data
Aug. 29, 2013 (JP) .................................. 2013-178177

(51) Int. Cl.
*H01L 23/498* (2006.01)
*H05K 5/00* (2006.01)
(Continued)

(52) U.S. Cl.
CPC ........... *H05K 5/0095* (2013.01); *H01L 21/50* (2013.01); *H01L 23/057* (2013.01); *H01L 23/10* (2013.01);
(Continued)

(58) Field of Classification Search
CPC ....... H01L 21/50; H01L 23/057; H01L 23/10; H01L 23/13; H01L 23/15;
(Continued)

(56) References Cited

U.S. PATENT DOCUMENTS

| 5,111,277 A | 5/1992 | Medeiros, III et al. |
| 5,188,985 A | 2/1993 | Medeiros, III et al. |

(Continued)

FOREIGN PATENT DOCUMENTS

| JP | 06-506321 A | 7/1994 |
| JP | 07-336046 A | 12/1995 |

(Continued)

OTHER PUBLICATIONS

Extended European Search Report, European Patent Application No. 14839509.8, dated Sep. 30, 2016, 10 pgs.

(Continued)

*Primary Examiner* — Megha M Gaitonde
(74) *Attorney, Agent, or Firm* — Volpe and Koenig, P.C.

(57) ABSTRACT

There are provided an electronic component housing package and the like which have high efficiency of heating by infrared rays. An electronic component housing package includes an insulating substrate including a plurality of insulating layers stacked on top of each other, an upper surface of the insulating substrate being provided with an electronic component mounting section. The plurality of insulating layers each contain a first material as a major constituent. The electronic component housing package comprises one or more infrared-ray absorbing layers disposed between the plurality of insulating layers and/or disposed on an upper surface of uppermost one of the plurality of insulating layers. The one or more absorbing layers contain a second material which is higher in infrared absorptivity than the first material.

10 Claims, 5 Drawing Sheets

(51) Int. Cl.
*H01L 23/057* (2006.01)
*H01L 23/00* (2006.01)
*H01L 23/15* (2006.01)
*H01L 21/50* (2006.01)
*H01L 23/13* (2006.01)
*H01L 23/10* (2006.01)
*H05K 5/02* (2006.01)
*H05K 5/06* (2006.01)

(52) U.S. Cl.
CPC .............. *H01L 23/13* (2013.01); *H01L 23/15* (2013.01); *H01L 23/49822* (2013.01); *H01L 23/49827* (2013.01); *H01L 24/97* (2013.01); *H05K 5/0213* (2013.01); *H05K 5/066* (2013.01); *H01L 24/32* (2013.01); *H01L 24/48* (2013.01); *H01L 24/73* (2013.01); *H01L 24/92* (2013.01); *H01L 2224/32225* (2013.01); *H01L 2224/48091* (2013.01); *H01L 2224/48227* (2013.01); *H01L 2224/73265* (2013.01); *H01L 2224/92247* (2013.01); *H01L 2224/97* (2013.01); *H01L 2924/00014* (2013.01); *H01L 2924/15156* (2013.01); *H01L 2924/15159* (2013.01); *H01L 2924/15313* (2013.01); *H01L 2924/15787* (2013.01); *H01L 2924/1676* (2013.01); *H01L 2924/16195* (2013.01); *H01L 2924/16747* (2013.01); *H01L 2924/3025* (2013.01)

(58) Field of Classification Search
CPC ......... H01L 23/49822; H01L 23/49827; H01L 24/32; H01L 24/48; H01L 24/73; H01L 24/92; H01L 24/97; H01L 2224/32225; H01L 2224/48091; H01L 2224/48227; H01L 2224/73265; H01L 2224/92247; H01L 2224/97; H01L 2924/00014; H01L 2924/15156; H01L 2924/15159; H01L 2924/15313; H01L 2924/15787; H01L 2924/16195; H01L 2924/16747; H01L 2924/1676; H01L 2924/3025; H05K 5/0095; H05K 5/0213; H05K 5/066; Y10T 428/24008; Y10T 428/24132; Y10T 428/24479; Y10T 428/24521; Y10T 428/24529; Y10T 428/24612; Y10T 428/24802; Y10T 428/24826; Y10T 428/24851; Y10T 428/24917; Y10T 428/24942; Y10T 428/2495
USPC ......... 428/99, 114, 156, 161, 162, 164, 172, 428/195.1, 198, 201, 209, 212, 213
See application file for complete search history.

(56) References Cited

U.S. PATENT DOCUMENTS

| | | | |
|---|---|---|---|
| 5,291,062 A * | 3/1994 | Higgins, III | ............ H01L 23/04 257/593 |
| 2003/0034554 A1* | 2/2003 | Onitani | ................... H01L 23/66 257/705 |
| 2006/0049396 A1 | 3/2006 | Pichler et al. | |
| 2012/0217660 A1 | 8/2012 | Tani et al. | |

FOREIGN PATENT DOCUMENTS

| | | |
|---|---|---|
| JP | 2001-308212 A | 11/2001 |
| JP | 2003-258139 A | 9/2003 |
| JP | 2005-158964 A | 6/2005 |
| JP | 2013-042003 A | 2/2013 |

OTHER PUBLICATIONS

International Search Report, PCT/JP2014/072034, dated Nov. 18, 2014, 2 pgs.

European Result of Consultation, European Patent Application No. 14839509.8, dated Oct. 19, 2017, 6 pgs.

* cited by examiner

ELECTRONIC COMPONENT HOUSING PACKAGE AND ELECTRONIC APPARATUS

TECHNICAL FIELD

The present invention relates to an electronic component housing package for hermetically sealing an electronic component, as well as to an electronic apparatus.

BACKGROUND ART

As an electronic component housing package in which an electronic component such as a semiconductor device or a piezoelectric device is mounted, use has been made of one constructed of an insulating substrate made of, for example, a ceramic material such as an aluminum oxide sintered body an upper surface of the insulating substrate being provided with an electronic component mounting section. In this construction, an electronic component is mounted on the mounting section, and, a lid body is bonded to the upper surface of the insulating substrate so as to cover the mounting section, thus hermetically sealing the electronic component in a region between the insulating substrate and the lid body.

Moreover, for example, the lid body and the insulating substrate are joined to each other by a joining technique such as brazing or welding. For example, a metal layer is disposed on an outer periphery of the upper surface of the insulating substrate, and, this metal layer and the metal-made lid body are joined to each other via a brazing material. Heat is applied to the brazing material by heating means such for example as application of infrared rays. Applied infrared rays are absorbed by the insulating substrate while being converted into heat energy, and, bonded areas of the brazing material and other component are subjected to the resultant heat.

CITATION LIST

Patent Literature

Patent Literature 1: Japanese Unexamined Patent Publication JP-A 2001-308212

SUMMARY OF INVENTION

Technical Problem

In the infrared heating operation, it is desirable to increase the infrared absorptivity of the insulating substrate. On the contrary, the insulating substrate made of, for example, an aluminum oxide sintered body has relatively low infrared absorptivity, wherefore it is difficult to achieve an increase in infrared absorptivity. This problem makes it difficult to increase the efficiency of heating the metal layer and a brazing material or the like to be bonded to the metal layer, for example, and this may constitute an impediment to improvement in hermetic sealing reliability and in electronic apparatus productivity.

Solution to Problem

An electronic component housing package in accordance with one embodiment of the invention comprises an insulating substrate including a plurality of insulating layers stacked on top of each other, an upper surface of the insulating substrate being provided with an electronic component mounting section. The plurality of insulating layers each contain a first material as a major constituent. In addition, the electronic component housing package comprises one or more infrared-ray absorbing layers disposed between the plurality of insulating layers and/or disposed on a region between an upper surface of uppermost one of the plurality of insulating layers and the metal layer. The one or more infrared-ray absorbing layers contain a second material which is higher in infrared absorptivity than the first material as a major constituent.

An electronic apparatus in accordance with one embodiment of the invention comprises the electronic component housing package as constituted above, an electronic component mounted on the mounting section, and a lid body bonded to the upper surface of the insulating substrate so as to cover the electronic component.

Advantageous Effects of Invention

According to the electronic component housing package in accordance with one embodiment of the invention, by virtue of the one or more infrared-ray absorbing layers, the infrared absorptivity of the insulating substrate is increased, thus achieving effective conversion of applied infrared rays into heat energy. Therefore, when the lid body is joined to the insulating substrate, the joined areas are heated with ease, thus facilitating improvement in hermetic sealing reliability, for example.

According to the electronic apparatus in accordance with one embodiment of the invention, the electronic component is hermetically sealed in the electronic component housing package as constituted above. Thus, it is possible to provide the electronic apparatus in which improvement in hermetic sealing reliability, for example, can be achieved with ease.

DESCRIPTION OF EMBODIMENTS

An electronic component housing package and an electronic apparatus pursuant to the invention will be described with reference to accompanying drawings. Note that the use of words "upper" and "lower" in the following description is merely for purposes of convenience in illustrating the construction, and thus these definitions do not necessarily apply to the electronic component housing package and so forth in practical use. Moreover, in the following description, infrared rays basically refer to light beams lying mainly in the near-infrared region that are readily absorbed by metal oxides in particular, and more specifically refer to infrared rays having wavelengths ranging from about 0.7 to 3 μm.

Figure 1:
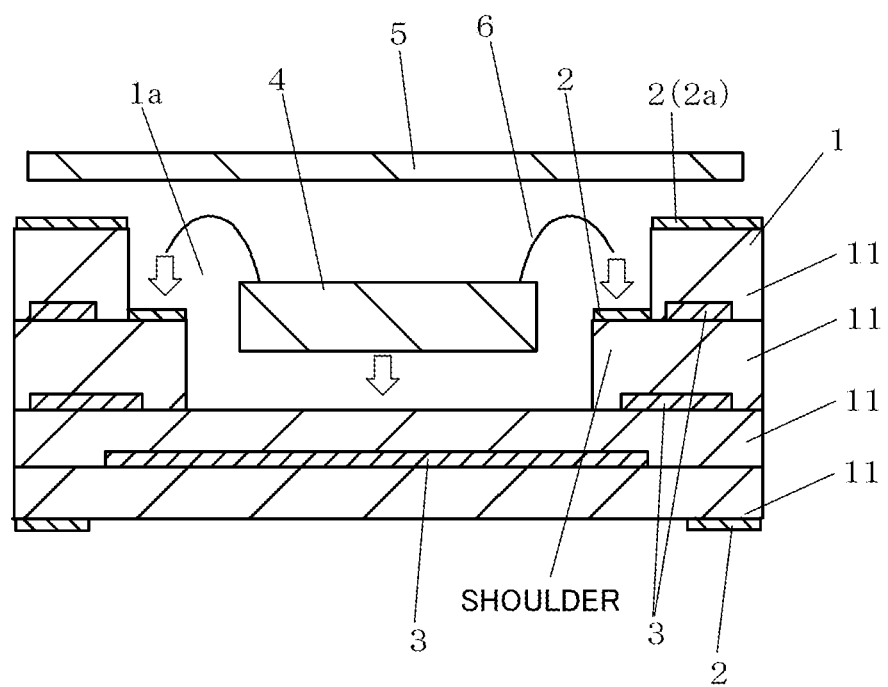
FIG. 1 is a sectional view showing an electronic component housing package and an electronic apparatus in accordance with an embodiment of the invention.

FIG. 1 is a sectional view (exploded view) showing an electronic component housing package and an electronic apparatus in accordance with an embodiment of the invention. The electronic component housing package for housing an electronic component 4 basically comprises an insulating substrate 1 having a recess 1a at an upper surface thereof, and a conductor layer 2 and an infrared-ray absorbing layer 3 that are disposed on or in the insulating substrate 1. The electronic component 4 is housed inside the recess 1a of the electronic component housing package, and, a lid body 5 is bonded to the upper surface of the insulating substrate 1 to cover the recess 1a, thus hermetically sealing the electronic component 4 in a housing constituted by the recess 1a and the lid body 5. Thereby, the electronic apparatus is constructed. In this example, the bottom of the recess 1a serves as a mounting section on which the electronic component 4 is mounted.

The insulating substrate 1 is shaped like a rectangular plate (rectangular prism) for example, and has the recess 1a for housing an electronic component provided in a center of the upper surface of the insulating substrate 1. The insulating substrate 1 is constructed of a stack of a plurality of flat ceramic insulating layers 11.

The ceramic insulating layers 11 (hereafter referred to simply as "insulating layers 11") are each made of a ceramic material including a first material such for example as an aluminum oxide sintered body, a glass-ceramic sintered body, or a mullite sintered body, and, for example, the insulating substrate 1 is constructed by co-firing the plurality of insulating layers 11 made of the same ceramic material. The first material, containing a metal oxide such for example as aluminum oxide as mentioned above (first metal oxide), is a major constituent of the ceramic material constituting the insulating layer 11. For example, where the insulating layer 11 is made of an aluminum oxide sintered body, the first metal oxide is aluminum oxide, and, on the other hand, where the insulating layer 11 is made of an aluminum oxide-silicate-based glass-ceramic sintered body, the first metal oxide is an aluminum oxide-silicon oxide composition.

In a case where the plurality of insulating layers 11 are each made of an aluminum oxide sintered body, the insulating substrate 1 is produced by molding a slurry, which is prepared by admixing suitable organic binder, solvent, and so forth in powder of a raw material such as aluminum oxide, silicon oxide, magnesium oxide, or calcium oxide, into sheet form by a sheet-molding technique such as doctor blade method to form a plurality of ceramic green sheets, a step of stacking the ceramic green sheets on top of each other in layers, and a step of firing the layered body at a high temperature. In this case, part of the ceramic green sheets is molded into frame-like form by a suitable punching process, and, this frame-shaped body is laminated on other flat ceramic green sheet, thus producing the insulating substrate 1 having the recess 1a.

The first material is not limited to the first metal oxide as mentioned above, but may comprise other substance which fulfills mechanical strength and characteristics such as electrical characteristics and thermal characteristics of the insulating substrate 1, and also achieves productivity, economy of manufacture, and so forth as required. Examples of mechanical strength include bending strength. Examples of electrical characteristics include relative permittivity and dielectric strength. Examples of thermal characteristics include heat conductivity.

Examples of the first material include various materials such as a non-oxide ceramic material containing a first metal nitride such as aluminum nitride and a second metal carbide such as silicon carbide, and a high-permittivity material such as barium titanate and strontium titanate. Moreover, the first metal oxide may be used in combination with other material such for example as beryllia, ferrite, forsterite, or steatite.

As described above, the recess 1a is a part of the housing for housing the electronic component 4 in a hermetically sealed condition. For example, the mounting section (the bottom of the recess 1a) has a quadrangular shape such as a rectangular shape as seen in plan view for efficient accommodation of the electronic component 4 having the shape of a rectangular plate, for example.

Moreover, in the insulating substrate 1 of the electronic component housing package in accordance with the embodiment, the inner surface of the recess 1a is stepped to provide a shoulder. The conductor layer 2 is disposed on an upper surface of the shoulder, as well as on an outer surface, such as upper and lower surfaces, of the insulating substrate 1. The conductor layer 2 is a portion which serves as a conductor path for electrically connecting the electronic component 4 housed inside the recess 1a to an external electric circuit (not shown). Moreover, of the conductor layers 2, one disposed on the upper surface of the insulating substrate 1 (conductor layer 2a) is a metal layer serving as an underlayer intended for the joining of the lid body 5 to the upper surface of the insulating substrate 1 by means of brazing or otherwise. In addition, these conductor layers 2 may be designed to act as conductors for shielding the electronic component 4 housed, while being sealed, inside the recess 1a from external electromagnetic radiation by making proper adjustments in respect of their arrangement or electric potentials.

The conductor layer 2 is made of a metal material such for example as tungsten, molybdenum, manganese, copper, silver, palladium, gold, platinum, nickel, or cobalt, or an alloy or a mixture of these metal materials. Moreover, the conductor layer 2 is formed on the insulating substrate 1 by means of metallization, plating, vapor deposition, or otherwise.

In a case where the conductor layer 2 is a layer obtained by metallization using tungsten for example, the conductor layer 2 is formed as follows. That is, a metal paste prepared by kneading powder of a metal material such as tungsten, an organic solvent, a binder, and so forth together is applied to a ceramic green sheet which constitutes the insulating substrate 1, and then the metal paste and the ceramic green sheet are co-fired. In this way, the conductor layer 2 in the form of a tungsten-metallized layer can be formed. Moreover, a plating layer containing, for example, nickel, copper, and gold may additionally be provided on the exposed surface of this metallized layer.

In the electronic component housing package as exemplified in FIG. 1, the electronic component 4 housed in the recess 1a is electrically connected to the conductor layer 2 disposed on the upper surface of the shoulder inside the recess 1a by a bonding wire 6. The conductor layer 2 lying on the upper surface of the shoulder is electrically connected to the conductor layer 2 lying on the lower surface of the insulating substrate 1 via a conductor for connection (not shown) including a through conductor (so-called via-conductor) disposed in the interior of the insulating substrate 1, for example. The electronic component 4 electrically connected to the conductor layer 2 lying on the upper surface of the shoulder is electrically connected to an external electric circuit via the above-mentioned connection conductor and the conductor layer 2 lying on the lower surface of the insulating substrate 1. The electrical connection between the conductor layer 2 lying on the lower surface of the insulating substrate 1 and an external electric circuit is established by, for example, a brazing material such as solder, an electrically-conductive adhesive, or a lead terminal.

The lid body 5 is a member which is bonded to the upper surface of the insulating substrate 1 to cover the recess 1a. As described above, the recess 1a becomes blocked by the lid body 5, thus hermetically sealing the electronic component 4 in the housing. The joining of the insulating substrate 1 and the lid body is effected by, for example, bonding the frame-shaped conductor layer 2 disposed on the upper surface of the insulating substrate 1 (frame-shaped part surrounding the recess 1a) and the metal-made lid body 5 to each other by a joining technique such as welding or brazing. In this case, examples of the metal material constituting the lid body 5 include an iron-based alloy material such as an iron-nickel alloy or an iron-nickel-cobalt alloy, or copper, or a copper-based alloy material. Moreover, the lid body 5 may be designed so that, for example, an outer periphery of a lower surface of the lid body to be bonded to the conductor layer 2 is made of metal, whereas other part (main body) is made of a ceramic material such as an aluminum oxide sintered body.

For example, the electronic apparatus, which is constructed by hermetically sealing the electronic component 4 in the electronic component housing package, is manufactured by performing the following process steps. That is, to begin with, the electronic component 4 is housed in the recess 1a of the insulating substrate 1, and is then secured to, for example, the bottom of the recess 1a by a joining material such as a brazing material (not shown). Moreover, the electronic component 4 and the conductor layer 2 lying on the shoulder are electrically connected to each other by the bonding wire 6. Next, the lid body 5 is set on the conductor layer 2 lying on the upper surface of the insulating substrate 1 so as to cover the recess 1a, and, heat is applied to the contacting areas of the conductor layer 2 and the lid body 5. At this time, in the case of joining the conductor layer 2 and the lid body 5 by a brazing joining technique, a brazing material having, for example, a frame-like shape is located between the conductor layer 2 and the lid body 5 (the outer periphery of the lower surface) in advance. Under the application of heat as stated above, the conductor layer 2 and the lid body 5, or equivalently the insulating substrate 1 and the lid body 5, are joined to each other via the brazing material, for example. Moreover, also in the case of joining the conductor layer 2 and the lid body 5 by welding, likewise, the lid body 5 is positioned properly on the conductor layer 2, and, heat is applied to the joined areas of them so that the conductor layer 2 and the lid body 5 (the insulating substrate 1 and the lid body 5) are welded to each other.

Various techniques may be employed as heating means. For example, when there is a need to create a vacuum in the space within the housing in which the electronic component 4 is hermetically sealed (so-called vacuum sealing), then the lid body 5 and the conductor layer 2 are joined together in a vacuum environment. In this case, as heating means, heating based on infrared irradiation (radiation heating) is performed. Moreover, the infrared radiation heating is not limited to the vacuum sealing, but may be adopted for other occasions depending upon, for example, workability and cost efficiency in joining the lid 5. In this case, for example, the insulating substrate 1 and the lid body 5, which are positioned relative to each other in the manner given above, are irradiated with infrared rays from an externally disposed infrared light-emitting apparatus. The infrared rays are absorbed by the insulating substrate 1 and so forth while being converted into heat energy, and this heat energy acts to heat the bonded areas of the brazing material and other component.

Infrared irradiation is effected by means of, for example, an infrared lamp heater which emits infrared rays of wavelengths in the near-infrared region as described earlier (not shown). In this case, a plurality of the insulating substrates 1 and a plurality of the lid bodies (not shown) are located en masse in proper relative positions in the manner given above, so that they can be irradiated with infrared rays all at once. Thereby, a plurality of electronic apparatuses can be manufactured at one time. Moreover, by preparing a wiring board having a plurality of regions each constituting a wiring board segment and a lid body having a plurality of regions each constituting a lid body segment, namely multiply-dividable wiring board and lid body (not shown), it is possible to facilitate the above-mentioned positioning process and joining process.

In the electronic component housing package and the electronic apparatus in accordance with the embodiment, an infrared-ray absorbing layer 3 containing a second material which is higher in infrared absorptivity than the first material is disposed between the plurality of insulating layers 11 and/or disposed on the upper surface of an uppermost one of the plurality of insulating layers 11. The absorbing layer 3 contains the second material having relatively high infrared absorptivity, and is thus higher in infrared absorptivity than the insulating layer 11. Accordingly, as described above, infrared rays applied in joining the lid body 5 can be absorbed in the insulating substrate 1 while being converted into heat energy more effectively, thus heating the joined area of the lid body 5 more effectively.

Thus, in joining the lid body 5 to the insulating substrate (conductor layer 2), the efficiency of heat application to the joined areas is increased. This makes it possible to provide an electronic component housing package that easily achieves improvement in lid-body 5 joining workability and in hermetic sealing reliability, as well as to provide a highly producible, and highly reliable electronic apparatus.

Another advantage resides in, for example, the capability of effecting sealing under heat with fewer energy (the amount of infrared rays, for example) consumption than ever, and the capability of reducing temperature variations during heat application to a large number of electronic component housing packages at one time.

It is preferable that the proportion of a second material content in the absorbing layer 3 is greater than or equal to 5% by mass in the interest of a sufficient increase in infrared absorptivity. Moreover, it is preferable that the proportion of the second material content in the absorbing layer 3 is less than or equal to 20% by mass in the interest of assuring tight adhesion between the absorbing layer 3 and the insulating layer 11. That is, it is preferable that the proportion of the second material content in the absorbing layer 3 falls within the range of 5 to 20% by mass.

Examples of the second material include a metal oxide which is higher in infrared absorptivity than the first metal oxide, the first metal nitride, and the first metal carbide as mentioned above (second metal oxide), a metal nitride (second metal nitride), and a metal carbide (second metal carbide). The details of the second material will be given later.

The absorbing layer 3 may contain, in addition to the second material, for example, a ceramic material composed predominantly of the first material such as the first metal oxide, the first metal nitride, or the first metal carbide as mentioned above, or a metal material similar to that constituting the conductor layer 2. The following description deals mainly with a case where the absorbing layer 3 contains the first metal oxide and the second metal oxide as major constituents.

In the case where the absorbing layer 3 is disposed between the plurality of insulating layers 11 and/or disposed on the upper surface of the uppermost one of the plurality of insulating layers 11, the insulating substrate 1 can be entirely heated effectively, and also a part of the insulating substrate 1 which is joined to the lid body 5, namely the upper surface of the uppermost insulating layer, can be heated effectively. In this case, if only the part of the insulating substrate 1 which is joined to the lid body 5 is heated, the possibility arises that the temperature of joined areas cannot be maintained with ease in the middle of joining the lid body 5. This may lead to a failure of improvement in workability and reliability in hermetic sealing. It is therefore preferable that the absorbing layer 3 is disposed both between the plurality of insulating layers 11 and on the upper surface of the uppermost one of the plurality of insulating layers 11.

Figure 2:
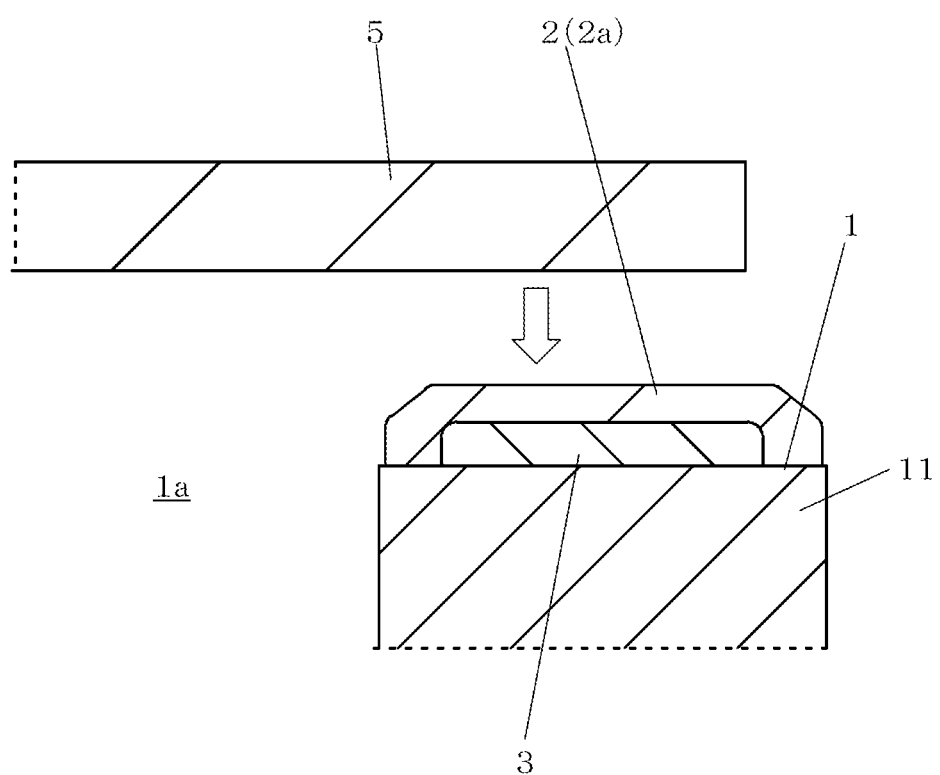
FIG. 2 is an enlarged sectional view illustrating a main part of a modified example of the electronic component housing package and the electronic apparatus shown in FIG. 1.

FIG. 2 is an enlarged sectional view illustrating a main part of a modified example of the electronic component housing package and the electronic apparatus shown in FIG. 1. In FIG. 2, constituent components which are similar to those in FIG. 1 are represented by the same reference signs. In the example shown in FIG. 2, the absorbing layer 3 (3a) is disposed on the upper surface of the uppermost one of the plurality of insulating layers 11. This absorbing layer 3 (3a) is interposed between the uppermost insulating layer 11 and the conductor layer 2 (2a) lying on the uppermost insulating layer 11. This makes it possible to further increase the efficiency of heating the conductor layer 2 (2a) lying on the uppermost insulating layer 11, which is a metal layer serving as an underlayer intended for the brazing or otherwise of the lid body 5. Note that the absorbing layer 3 may partly extend outward beyond the outer periphery of the conductor layer 2 (2a).

As described above, as the second material, it is possible to appropriately use various materials that are higher in infrared absorptivity than the first material, with consideration given to productivity, physical properties or characteristics other than infrared absorptivity (for example, magnetic property, radiation property, melting point, relative permittivity, etc.), economy of manufacture, and other requirements.

For example, when the first material is the first metal oxide such as aluminum oxide, examples of the second material include the second metal oxide such as magnesium oxide, zirconium oxide, titanium oxide, chromium oxide, copper oxide, manganese oxide, silicon oxide, nickel oxide, tungsten oxide, zinc oxide, molybdenum oxide, and iron oxide.

Moreover, when the first material is the first metal nitride such as aluminum nitride, examples of the second material include the second metal nitride such as iron nitride and silicon nitride.

Furthermore, when the first material is the first metal carbide such as silicon carbide, examples of the second material include the second metal carbide such as silicon carbide which is higher in content of, for example, nitrogen or aluminum than the silicon carbide used as the first material, and is colored black, for example.

Moreover, the second material is not limited to the second metal oxide, the second metal nitride, and the second metal carbide, but may comprise a carbon material such as graphite or diamond-like carbon (DLC).

In a case where the first material is the first metal oxide, the first metal nitride, or the first metal carbide, and the second material is the second metal oxide, the second metal nitride, or the second metal carbide, then it is possible to facilitate co-firing of the insulating layer 11 and the absorbing layer 3. This is advantageous from the standpoint of imparting mechanical strength, which involves tight adhesion between the insulating layer 11 and the absorbing layer 3, to the insulating substrate 1, and also from the viewpoint of wiring board productivity, for example.

Moreover, the first material and the second material do not necessarily have to be inorganic metal compounds of the same type (oxides, nitrides, or carbides), respectively, and may therefore be used as a combination of different compounds. For example, when the first material is the first metal oxide such as an aluminum oxide sintered body, as the second material, the second metal nitride such as iron nitride or the second metal carbide such as silicon carbide may be used. Moreover, when the second material is the first metal nitride such as aluminum nitride, as the second material, the second metal oxide such as chromium oxide or the second metal carbide such as silicon carbide may be used. Furthermore, when the second material is the first metal carbide such as silicon carbide, as the second material, the second metal oxide such as chromium oxide or the second metal nitride such as iron nitride may be used.

In a case where the first material is the first metal oxide and the second material is the second metal oxide, it is possible to further facilitate co-firing of the insulating layer 11 and the absorbing layer 3. Furthermore, it is possible to facilitate maintaining the firing temperature at a relatively low temperature level. This is more advantageous from the standpoint of imparting mechanical strength, which involves tight adhesion between the insulating layer 11 and the absorbing layer 3, to the insulating substrate 1, and also from the viewpoint of wiring board productivity, for example.

Moreover, an area dimension of the absorbing layer 3 as seen in plan view (hereafter also referred to simply as "a dimension of the absorbing layer 3") is determined properly so as not to impair tight adhesion between adjacent upper and lower insulating layers 11, with consideration given to an expected infrared absorption amount (heat generation amount) in each inter-layer region between the plurality of insulating layers 11, the position of the conductor layer 2, and other requirements. At this time, if the dimension of the absorbing layer 3 is nearly equal to the entire area of the inter-layer region between the upper and lower insulating layers 11, the degree of adhesion between the upper and lower insulating layers 11 may be decreased. Especially, if the absorbing layer 3 is interposed between the layers so as to extend to the outer periphery of the insulating layer 11, the degree of adhesion between the individual insulating layers 11 at the outer periphery will be decreased, thus increasing the likelihood of poor adhesion between the layers (so-called delamination). It is therefore preferable that the dimension of the absorbing layer 3 falls within the limit of about 80% of the area of the inter-layer region between the insulating layers 11 as seen in transparent plan view. Moreover, it is preferable that the inter-layer region at the outer periphery of the insulating layer 11 is free of the absorbing layer 3.

The second material such as the above-mentioned second metal oxide may be contained in the insulating layer 11. For example, as a pigment for coloring the insulating layer 11, chromium oxide may be contained in the insulating layer 11. In this case, however, a too large second metal oxide content in the insulating layer 11 may cause a decrease in the degree of adhesion between the individual insulating layers 11. It is therefore preferable that the proportion of the second material content in the insulating layer 11 is smaller than the proportion of the second material content in the absorbing layer 3. In other words, it is more preferable that the proportion of the second material content in the absorbing layer 3 is greater than the proportion of the second material content in the insulating layer 11 in the interest of tight adhesion between the layers and improvement in infrared absorption efficiency.

Moreover, the use of one or more metal oxides selected from among magnesium oxide, zirconium oxide, titanium oxide, chromium oxide, copper oxide, manganese oxide, silicon oxide, nickel oxide, tungsten oxide, and zinc oxide as the second metal oxide constituting the second material is more advantageous from the viewpoint of heat generation resulting from infrared absorption. That is, these metal oxides each have an atomic structure which is susceptible to oscillation under infrared radiation (electromagnetic radiation) in particular, wherefore the conversion of infrared ray to heat energy induced by atomic oscillation is carried out more effectively. Thus, infrared electromagnetic energy is absorbed by the absorbing layer 3 more efficiently for conversion into heat energy.

Moreover, in particular, the use of magnesium oxide, zirconium oxide, titanium oxide, chromium oxide, or copper oxide as the second metal oxide is conducive to high infrared absorptivity, and thus to high efficiency of conversion into heat energy. In addition, these metal oxides tend to be superior to other metal oxides in points of, for example, mixability with the first metal oxide and adherability of the absorbing layer to the insulating layer 11, wherefore the mixing and the adhesion are effected more easily or more successfully.

For example, as for the above-mentioned infrared rays of wavelengths in the near-infrared region, infrared absorptivity can be determined by measurement means such for example as spectral transmission or reflectance.

Moreover, some infrared lamp heaters also emit infrared rays of wavelengths in the far-infrared region. As for the infrared rays of wavelengths in the far-infrared region, infrared absorptivity can be determined by measurement means such as spectral emissivity measurement using FTIR.

The infrared absorptivity of the first metal oxide used as the first material, which is aluminum oxide for example, is about 40% for infrared rays in the range of from the near-infrared to far-infrared.

The infrared absorptivity of the second metal oxide used as the second material, which is copper oxide for example, is about 85% for infrared rays of wavelengths in the near-infrared region, and is about 80% for infrared rays of wavelengths in the far-infrared region. Moreover, the infrared absorptivity of the second metal oxide used as the second material, which is chromium oxide for example, is about 70% for infrared rays of wavelengths in the near-infrared region, and is about 85% for infrared rays of wavelengths in the far-infrared region.

The infrared absorptivity of the absorbing layer 3 is about 50 to 95%, for example, which is about 1.2 to 2 times the infrared absorptivity of the insulating layer 11.

For example, in a case where the first material is the first metal oxide and the second material is the second metal oxide, then the absorbing layer 3 is formed by performing the following process steps, namely preparing a ceramic paste by adding powder of the above-mentioned second metal oxide to powder of a ceramic material similar to that used to form the insulating layer 11 (ceramic material composed predominantly of the first metal oxide), and then kneading the powder mixture with an organic solvent and a binder, applying the ceramic paste to a predetermined part of the surface of a ceramic green sheet which constitutes the insulating layer 11 by means of screen printing or otherwise, stacking the ceramic green sheets together, and firing the stack. In this way, it is possible to produce the insulating substrate 1 provided with the absorbing layer 3 located in a predetermined part of the surface of the insulating layer 11.

In this example, since the absorbing layer 3 has a first metal oxide content, it is possible to assure the adherability of the absorbing layer 3 to the insulating layer 11 which also contains the first metal oxide as a major constituent. It is therefore preferable that the first metal oxide contained in the insulating layer 11 and the first metal oxide contained in the absorbing layer 3 are of similar materials.

Moreover, also in a case where the first material is the first metal nitride or the first metal carbide, and the second material is the second metal nitride or the second metal carbide, as is the case with the above-mentioned oxide materials, the absorbing layer 3 can be formed by co-firing with the insulating layer 11.

Figure 3:
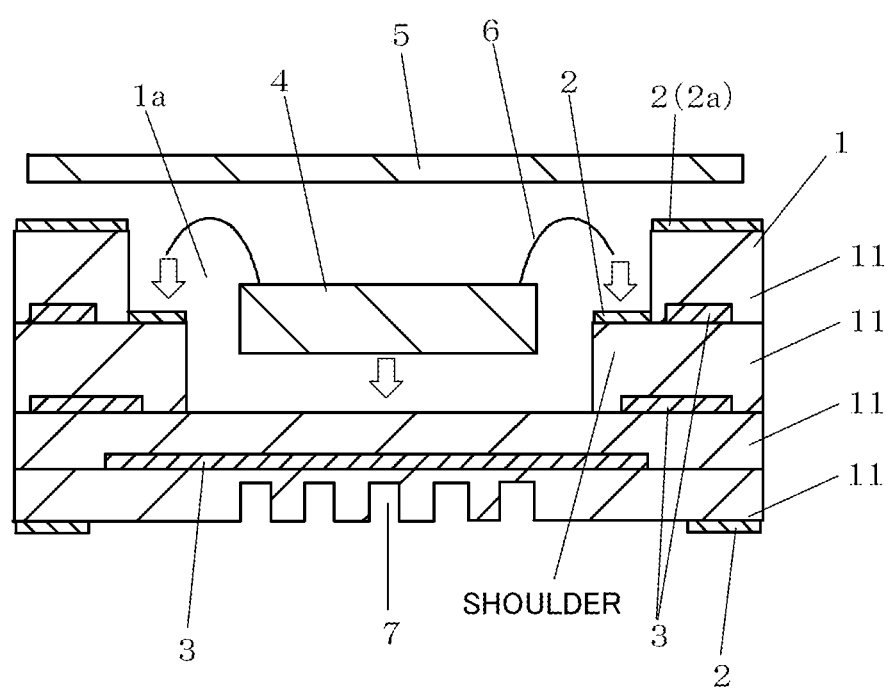
FIG. 3 is a sectional view showing another modified example of the electronic component housing package and the electronic apparatus shown in FIG. 1.
Figure 4:
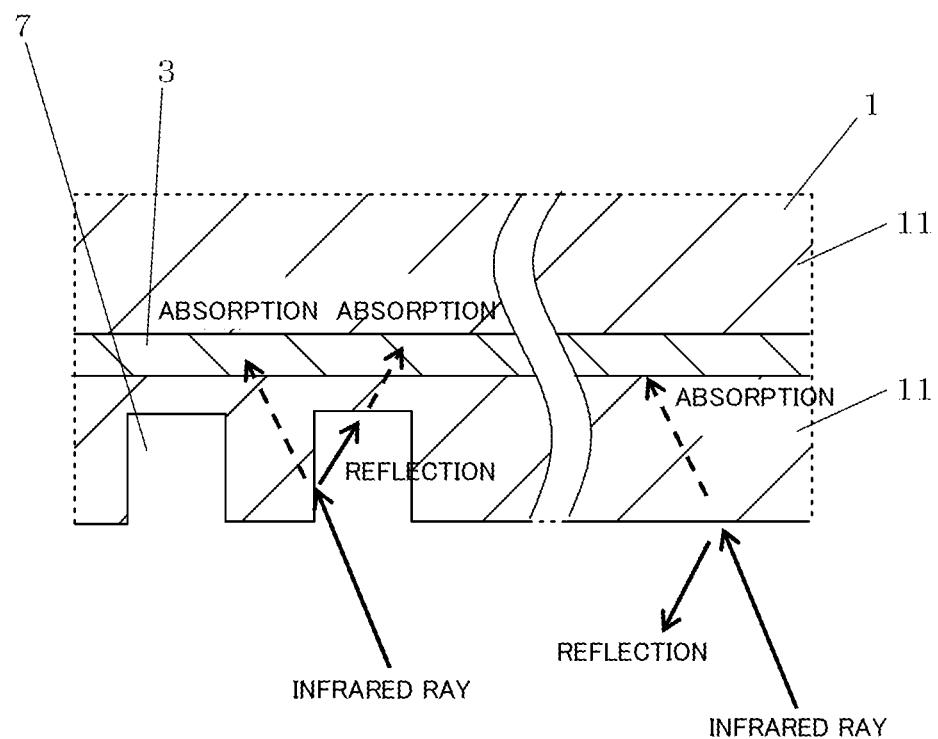
FIG. 4 is a main-part sectional view schematically showing advantageous effects produced by a concavity portion.

FIG. 3 is a sectional view showing a modified example of the electronic component housing package and the electronic apparatus shown in FIG. 1. Moreover, FIG. 4 is a main-part sectional view schematically showing advantageous effects produced by a concavity portion which will hereafter be described. In FIGS. 3 and 4, constituent components which are similar to those in FIG. 1 are represented by the same reference signs. In the example shown in FIGS. 3 and 4, a plurality of concavity portions 7 are provided in the lower surface of the insulating substrate 1. The left-hand part of FIG. 4 shows a part of the insulating substrate 1 which is provided with the concavity portions 7. The right-hand part of FIG. 4, which is given for reference purposes, shows a concavity portion 7-free part of the insulating substrate 1. In the insulating substrate 1 having the concavity portions 7, as shown in the left-hand part of FIG. 4, for example, when infrared rays are applied to the insulating substrate 1 from below, of the infrared rays, one which has reached the lower surface of the insulating substrate 1 is absorbed also by the inside of the concavity portion 7 (surface part of the insulating substrate located within the concavity portion 7). Moreover, an infrared ray reflected from the surface part within the concavity portion 7 (internal surface) can be absorbed also by other internal surface opposed to the internal surface subjected to the reflection. In addition, an infrared ray reflected from the inner surface of the concavity portion 7 enters the interior of the insulating substrate 1 so as to be absorbed also by the absorbing layer 3 effectively. If there is no concavity portion 7, for example, as shown in the right-hand part of FIG. 4, part of infrared rays reflected from the lower surface of the insulating substrate 1 is simply dissipated to outside, and is therefore not conducive to application of heat to the insulating substrate 1.

Thus, in addition to an increase in the efficiency of infrared absorption by the absorbing layer 3, an increase in infrared absorptivity with the concavity portion 7 is achieved. Accordingly, in a case of this example, it is possible to provide an electronic component housing package and an electronic apparatus that are advantageous from the viewpoint of a further increase in infrared absorptivity.

The concavity portion 7 may be made either as a recess having a circular shape or a polygonal shape (including a rectangular shape), or as a slim, strip-like slot as seen in plan view (bottom view). The planar configuration of the concavity portion 7 is determined properly, with consideration given to the mechanical strength of the insulating substrate 1 (bottom part of the recess 1a, in particular), desired heat dissipation capability, the position of placement of the conductor layer 2, the position of placement of the absorbing layer 3, workability and cost efficiency in the formation of the concavity portion 7, and other requirements.

The concavity portion 7 may be formed by making a dent, under pressure, in part of the lower surface of a layered body of ceramic green sheets which is formed into the insulating substrate 1. The concavity portion 7 may alternatively be formed by creating, in part of the ceramic green sheets, for example, a recessed opening (which does not pass through the ceramic green sheet), a through hole, or a slot by means of machining, lasering, or otherwise, stacking this ceramic green sheet, which is set as the lowermost sheet, and other ceramic green sheets together, and firing the sheets into a single body. In another alternative, the concavity portion 7 may be formed by grinding the lower surface of the fired insulating substrate 1, for example.

Where application of infrared rays to the insulating substrate 1 is concerned, in a case where the conductor layer 2 is disposed on that part of the insulating substrate 1 which is joined to the lid body 5 (frame-shaped part surrounding the recess, for example), it is effective to apply infrared rays to the insulating substrate 1 from under a lower surface thereof. This is because the applied infrared ray is not absorbed by the conductor layer 2, and is easily reflected therefrom, thus causing the possibility that the frame-shaped conductor layer 2 will constitute an impediment to infrared heating to the joined areas of the insulating substrate 1 and the lid body 5. In the case of applying infrared rays to the insulating substrate 1 from under the lower surface thereof, the insulating substrate 1, including the area joined to the lid body 5 and nearby areas, can be heated more effectively unimpeded by the frame-shaped conductor layer 2.

Figure 5:
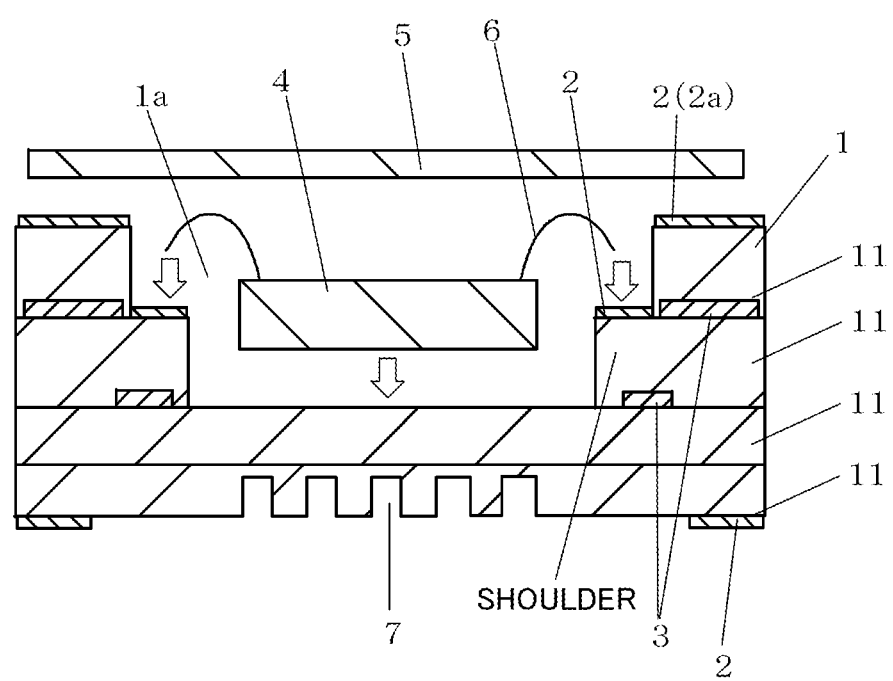
FIG. 5 is a sectional view showing another modified example of the electronic component housing package and the electronic apparatus shown in FIG. 1.

FIG. 5 is a sectional view showing another modified example of the electronic component housing package and the electronic apparatus shown in FIG. 1. In FIG. 5, constituent components which are similar to those in FIG. 1 are represented by the same reference signs. In the example shown in FIG. 5, the infrared-ray absorbing layers are disposed on a plurality of inter-layer regions between the plurality of insulating layers 11. Moreover, among areas of the infrared-ray absorbing layers 3 disposed on the plurality of inter-layer regions, an area of an infrared-ray absorbing layer 3 lying on an upper-located inter-layer region is larger than an area of an infrared-ray absorbing layer 3 lying on a lower-located inter-layer region, as seen in plan view. In this case, for example, when infrared rays are applied to the insulating substrate 1 from below, the amount of infrared rays absorbed by the absorbing layer located on the lower side of the insulating substrate 1 can be kept small. This makes it possible to increase the amount of infrared rays that reach a part of the insulating substrate 1 which is close to the upper surface thereof to be joined to the lid body 5. Thus, when the lid body 5 is joined to the insulating substrate 1, it is possible to increase the efficiency of heating a part of the upper surface of the insulating substrate 1 which bears the conductor layer 2 (2a) to which the lid body 5 is joined.

Accordingly, in this example, it is possible to provide an electronic component housing package and an electronic apparatus that are advantageous from the viewpoint of an increase in infrared absorptivity in a part of the insulating substrate 1 which is close to the area thereof to be joined to the lid body 5.

It should be understood that the application of the invention is not limited to the embodiments described heretofore, and that various changes and modifications are possible without departing from the scope of the invention. For example, when the absorbing layers 3 are disposed on a plurality of inter-layer regions between the plurality of insulating layers 11, the absorbing layers 3 may be arranged on the plurality of inter-layer regions in non-overlapping relation to one another as seen in transparent plan view. In this case, for example, in applying infrared rays to the lower surface of the insulating substrate 1, it is possible to diminish the likelihood that the conductor layer 2 lying on a certain inter-layer region impedes the travel of an infrared ray to another conductor layer 2 lying on a different inter-layer region located above or below the certain inter-layer region. This helps reduce variations in the amount of heat generation resulting from infrared absorption among the absorbing layers 3 disposed on a plurality of inter-layer regions, respectively.

Moreover, as described above, the material which is contained, together with the second material such as the second metal oxide, in the absorbing layer 3 may be a metal material similar to that constituting the conductor layer 2. In this case, the absorbing layer 3 can be utilized also as, like the conductor layer 2, a conductor path, or as a grounding conductor layer, or a conductor layer for power supply, for example. Also in this case, it is preferable that the proportion of the second material (second metal oxide) content in the absorbing layer 3 falls within the range of 5 to 20% by mass. This makes it possible to assure the adherability of the absorbing layer 3 to the insulating layer 11 more successfully, as well as to impart electrical conductivity to the absorbing layer 3 which serves also as a conductor path or the like more easily.

REFERENCE SIGNS LIST

1: Insulating substrate
11: Ceramic insulating layer
1a: Recess
2: Conductor layer
3: Absorbing layer
4: Electronic component
5: Lid body
6: Bonding wire
7: Concavity portion

The invention claimed is:

1. An electronic component housing package, comprising:
an insulating substrate including a plurality of insulating layers stacked on top of each other, an upper surface of the insulating substrate being provided with an electronic component mounting section, the plurality of insulating layers each containing a first material as a major constituent;
one or more infrared-ray absorbing layers disposed between the plurality of insulating layers and on an upper surface of uppermost one of the plurality of insulating layers, the one or more infrared-ray absorbing layers comprising a top surface, a bottom surface and opposing side surfaces extending between the top surface and the bottom surface, the one or more infrared-ray absorbing layers containing a second material which is higher in infrared absorptivity than the first material; and
a conductor layer which covers the entire top surface of the one or more infrared-ray absorbing layers on the upper surface of the uppermost one of the plurality of insulating layers and which contacts the entire opposing side surfaces of the one or more infrared-ray absorbing layers on the upper surface of the uppermost one of the plurality of insulating layers.

2. The electronic component housing package according to claim 1,
wherein the first material is a first metal oxide, a first metal nitride, or a first metal carbide, and the second material is a second metal oxide, a second metal nitride, or a second metal carbide.

3. The electronic component housing package according to claim 2,
wherein the first material is a first metal oxide, and the second material is a second metal oxide.

4. The electronic component housing package according to claim 3,
wherein the plurality of insulating layers each contain the second metal oxide, and
a proportion of content of the second metal oxide in the one or more infrared-ray absorbing layers is greater than a proportion of content of the second metal oxide in the plurality of insulating layers.

5. The electronic component housing package according to claim 3,
wherein the second metal oxide comprises one or more metal oxides selected from among magnesium oxide, zirconium oxide, titanium oxide, chromium oxide, copper oxide, manganese oxide, silicon oxide, nickel oxide, tungsten oxide, and zinc oxide.

6. The electronic component housing package according to claim 1,
wherein a lower surface of the insulating substrate is provided with a plurality of concavity portions.

7. The electronic component housing package according to claim 1, wherein the one or more infrared-ray absorbing layers comprise two or more infrared-ray absorbing layers disposed on a plurality of inter-layer regions between the plurality of insulating layers,
among areas of the two or more infrared-ray absorbing layers disposed on the plurality of inter-layer regions, an area of an infrared-ray absorbing layer lying on an upper-located inter-layer region being larger than an area of an infrared-ray absorbing layer lying on a lower-located inter-layer region, as seen in a plan view.

8. The electronic component housing package according to claim 1, wherein a proportion of a second material content in the one or more infrared-ray absorbing layers is within a range of 5% by mass to 20% by mass of the one or more infrared-ray absorbing layers.

9. The electronic component housing package according to claim 1, wherein the conductor layer comprises a top portion and opposing side portions extending between the top portion and the upper surface of the uppermost one of the plurality of insulating layers, the top portion of the conductor layer covering the entire top surface of the one or more infrared-ray absorbing layers and each one of the opposing side portions contacting one of the opposing side surfaces of the one or more infrared-ray absorbing layers.

10. An electronic apparatus, comprising:
the electronic component housing package according to claim 1;
an electronic component mounted on the mounting section; and
a lid body joined to the upper surface of the insulating substrate so as to cover the electronic component.

* * * * *